United States Patent
Azadet et al.

(10) Patent No.: US 12,273,074 B2
(45) Date of Patent: Apr. 8, 2025

(54) METHOD AND SYSTEM FOR DIGITAL CORRECTION FOR A DYNAMICALLY VARYING NON-LINEAR SYSTEM

(71) Applicant: Intel Corporation, Santa Clara, CA (US)

(72) Inventors: Kameran Azadet, San Ramon, CA (US); Marc Jan Georges Tiebout, Finkenstein (AT); Ramon Sanchez, Galapagar MD (ES); Hazar Yuksel, White Plains, NY (US)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/358,042

(22) Filed: Jun. 25, 2021

(65) Prior Publication Data
US 2022/0416729 A1    Dec. 29, 2022

(51) Int. Cl.
H03F 1/32      (2006.01)
H03F 3/21      (2006.01)

(52) U.S. Cl.
CPC ............. *H03F 1/3247* (2013.01); *H03F 3/21* (2013.01); *H03F 2200/129* (2013.01)

(58) Field of Classification Search
CPC .................................................. H03F 1/32
USPC ........................................ 330/149; 375/297
See application file for complete search history.

(56) References Cited

U.S. PATENT DOCUMENTS

| | | | |
|---|---|---|---|
| 6,342,810 B1* | 1/2002 | Wright | H03F 1/3252 330/129 |
| 7,333,559 B2* | 2/2008 | Song | H03F 1/3247 375/296 |
| 7,822,146 B2* | 10/2010 | Copeland | H03F 1/3241 375/295 |
| 2004/0179629 A1* | 9/2004 | Song | H03F 1/3247 375/296 |
| 2018/0331662 A1* | 11/2018 | Maa | H03F 1/30 |
| 2019/0238204 A1 | 8/2019 | Kim et al. | |

\* cited by examiner

*Primary Examiner* — Henry Choe
(74) *Attorney, Agent, or Firm* — 2SPL Patent Attorneys PartG mbB; Yong Beom Hwang

(57) ABSTRACT

A system and method for digital correction for a dynamically varying non-linear system. The system includes a correction circuitry including at least one look-up table (LUT). The correction circuitry is configured to receive an input signal and modify the input signal to be processed by the non-linear system using at least one LUT to correct non-linearity incurred by the non-linear system. The at least one LUT is addressed by a magnitude or power of the input signal and a dynamically varying parameter associated with the input signal. The dynamically varying parameter may be one of average signal power of the input signal, a differential of the average power of the input signal, a directional beam index, or temperature.

17 Claims, 11 Drawing Sheets

METHOD AND SYSTEM FOR DIGITAL CORRECTION FOR A DYNAMICALLY VARYING NON-LINEAR SYSTEM

FIELD

Examples relate to digital correction for a non-linear system, more particularly a method and system for digital correction for a dynamically varying non-linear system.

BACKGROUND

Digital pre-distortion is a technique used to linearize non-linear systems such as a power amplifier (PA) to improve the efficiency of the non-linear systems. A digital pre-distortion circuit inversely models the gain and phase characteristics of the non-linear system and produces an overall system that is more linear and reduces distortion than would otherwise be caused by the non-linear system. An inverse distortion is introduced into the input of the non-linear system, thereby reducing any non-linearity that the non-linear system might otherwise exhibit.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
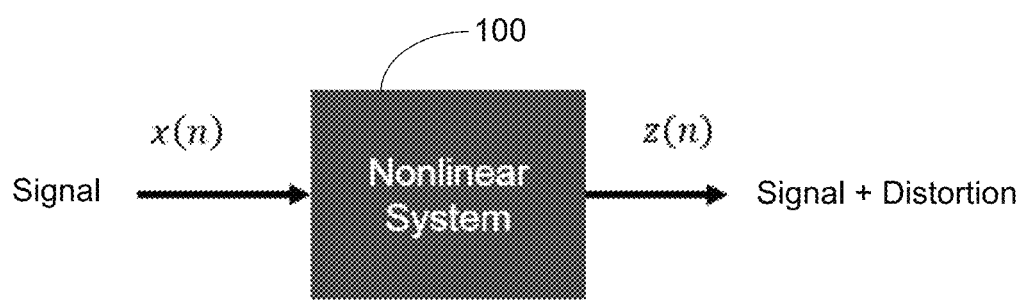
FIG. 1 shows a non-linear system.

FIG. 1 shows a non-linear system 100. The non-linear system 100 (e.g., a power amplifier (PA), a digital-to-analog converter (DAC), an analog-to-digital converter (ADC), etc. in a transmitter or a receiver) introduces a non-linear distortion at the output of the non-linear system 100. The non-linear system 100 receives an input signal x(n) and generate an output signal z(n). Due to the non-linear effects of the non-linear system 100, non-linear distortions may be present at the output signal z(n).

Figure 2:
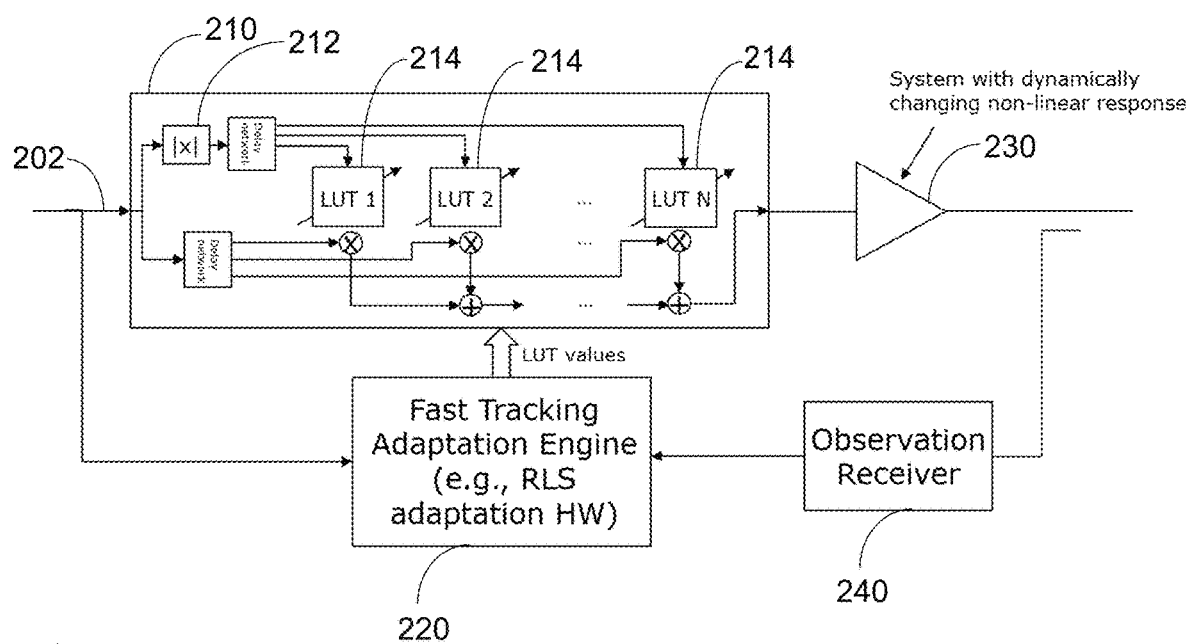
FIG. 2 shows a conventional solution for digital adaptation for a dynamically varying system.

In dynamically varying systems such as Fifth Generation (5G) mmWave power amplifiers with analog or hybrid beamforming or fast varying transmit power, digital pre-distortion (DPD) adaptation becomes extremely hard. Typical solution is to have a fast adaptation in hardware, for example using least mean square (LMS) or recursive least square (RLS) adaptation algorithms to track fast changes in the PA response. FIG. 2 shows a conventional solution for digital adaptation for a dynamically varying system. The correction system 210 includes look-up tables (LUTs) 214 that are addressed by the magnitude of the input signal, which is computed by the magnitude computation circuit 212. The LUT values and the input signal are multiplied and summed over to generate the pre-distorted input signal to the non-linear system 230. The LUT values are adapted by the fast-tracking adaptation engine 220 (e.g., RLS adaptation hardware) based on the input signal and the feedback signal from the observation receiver 240.

Increasing the adaptation speed on a real-time adaptation hardware results in a very significant increase in complexity. RLS is faster than LMS, but it is a lot more complex than LMS and at some point it becomes simply impractical as wireless communication standards evolve from 5G to Sixth Generation (6G) and time slot reduces by an order or magnitude to a few 10 s of micro-second (possibly even few microseconds in the future). Therefore, there is a need for a solution where dynamic changes can be included in the digital correction model (e.g., DPD model) allowing slow adaptation, possibly off-line on a central processing unit (CPU).

Figure 3:
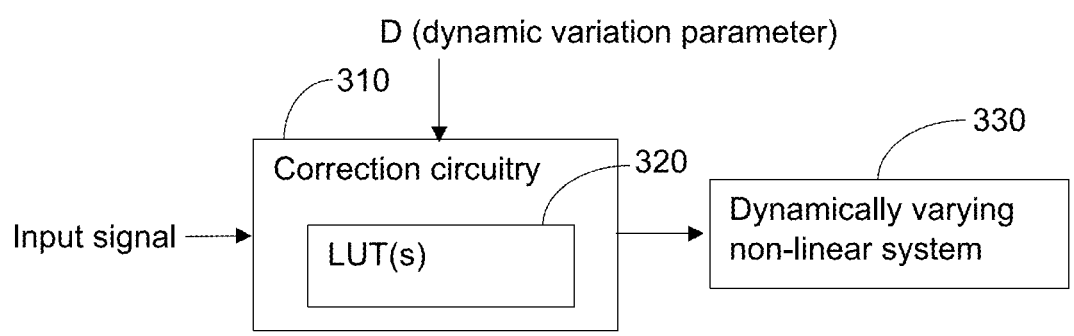
FIG. 3 shows an example system for digital correction for a dynamically varying non-linear system.

FIG. 3 shows an example system for digital correction for a dynamically varying non-linear system. The system includes a correction circuitry 310 which includes at least one look-up table (LUT) 320. The correction circuitry 310 is configured to receive an input signal and modify the input signal to be processed by the non-linear system 330 using at least one LUT 320 to correct non-linearity incurred by the non-linear system 330. The non-linear system 330 has a dynamically changing time-varying non-linear responses depending on the dynamic variation parameter (such as average power, beam index, temperature, etc.). For example, the dynamic time-varying non-linear response in power amplifier may be caused by thermal effects, trapping effects, beam steering angle changes, etc. The at least one LUT 320 is addressed by a dynamically varying parameter associated with the input signal. The dynamically varying parameter may be the average signal power of the input signal, a differential of the average power of the input signal, a directional beam index, temperature, etc.

The non-linear system 330 may include a power amplifier or a front-end circuitry and a quantizer in a receiver. The at least one LUT may use coarse quantization of the dynamically varying parameter, and interpolation or extrapolation of LUT values obtained from the at least one LUT may be performed to obtain fine-granularity LUT values. For example, the interpolation or extrapolation may be one of linear, cubic spline, bi-linear interpolation or extrapolation. The LUT may be addressed by a horizontal beam index, a vertical beam index, or both. The at least one LUT may include a plurality of one-dimensional LUTs or a multi-dimensional LUT(s).

The correction circuitry 310 may be provided for linearizing any non-linear system. The correction circuitry 310 may be included in a transmitter, which may be included for example in a base station or a user equipment. Alternatively, the correction circuitry 310 may be included in a receiver. The correction circuitry 310 may be implemented as a digital pre-distortion (DPD) system in a transmitter. The non-linear system 330 may include a PA, a DAC, an ADC, a receiver front-end circuitry, or any other device having non-linear response characteristics.

The correction circuitry 310 receives an input signal and modifies the input signal to generate an output signal. The correction circuitry 310 may implement a mathematical model that produces an approximation of the inverse function of the non-linear system 330. By pre-distorting/modifying the input signal to the non-linear system 330 the non-linear effects of the non-linear system 330 can be compensated and the output of the non-linear system 330 may be linearized.

The non-linear system 330 (such as a PA, a DAC, an ADC, etc.) may be modeled using polynomials or piece-wise polynomial functions to characterize the non-linear response of the system. The terms (e.g., polynomial terms) of the mathematical model for the correction circuitry 310 typically resemble that of the non-linearity with different parameters. Polynomial-based correction circuitry receives input samples and applies the polynomial functions of the model to the input samples to generate pre-corrected (pre-distorted) outputs. More specifically, the polynomial correction systems may evaluate each of a set of polynomials given one or more input samples, apply the polynomial outputs as a gain factor to a function of the input samples, and sum the resulting samples to generate the pre-corrected (pre-distorted) output. Assuming a suitable selection of modeling polynomials, the pre-corrected (pre-distorted) outputs may represent the inverse of the actual non-linearities of the non-linear system 330, which may be substantially canceled when the correction circuitry outputs are applied as input to the non-linear system 330.

In examples, the correction circuitry 310 may include at least one LUT 320. The correction circuitry 310 is configured to receive input data (a sequence of input samples) and modify the input data using the at least one LUT 320. Outputs of each LUT 320 may depend on the current input sample and/or a past input sample depending on whether the system model is memoryless or with memory. For example, the LUT 320 may be implemented based on a generalized memory polynomial (GMP) model. The correction circuitry 310 receives the input signal, identifies corresponding LUT coefficients for each LUT, and generates output data (a sequence of output samples) according to the relevant LUT coefficients of the LUT(s). The modified input data is sent to the non-linear system 330.

Figure 4:
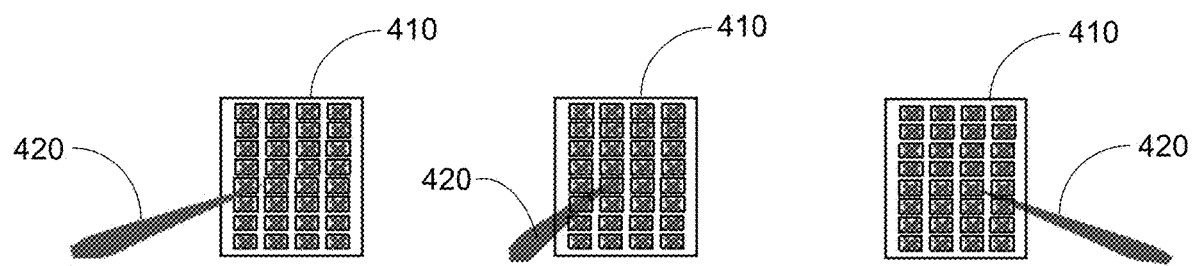
FIG. 4 shows example beamforming with an array of antennas.

Beamforming is a technique that generates a wireless signal towards a specific direction, rather than having the signal spread in all directions from an antenna. FIG. 4 shows example beamforming with an array of antennas. For beamforming, an array of antennas 410 (or antenna elements) in close proximity radiate the same signal with different amplitude and/or phase such that the radiated signals from the antennas/antenna elements constructively and destructively interfere each other to form a beam 420 in a specific direction. The directional beamforming may be performed in a horizontal direction, in a vertical direction, or both.

In beamforming systems, a response of each PA coupled to each antenna/antenna element changes with a change of beam direction (in high power regime), due to load pull of different PAs, and rapid phase changes caused by beamforming. The DPD would have to react very fast (e.g., 125 μs-250 μs slot times). However, the adaptation speed would have to be too high such that DPD adaptation may not be practical. This will get worse as slot times decrease over generations of wireless standards (Sixth Generation (6G) and beyond).

In analog and hybrid beamforming for example in mmWave systems, conventionally DPD has not been used since adaptation of the DPD is difficult. However, DPD benefits are very significant in improving the PA efficiency and increase transmit power. Therefore, there is a strong need to develop a DPD (digital correction) solution for beamforming systems.

Figure 5:
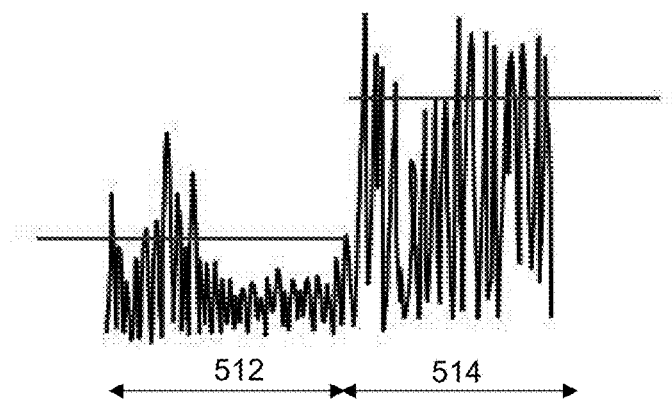
FIG. 5 shows the case that the average transmit power changes over slots.

In some systems, the PA response may change dynamically over time. For example, the average power of a transmit signal may change dynamically, e.g., from one slot to another. FIG. 5 shows the case that the average transmit power changes over slots 512, 514.

To track fast a PA dynamic response change (e.g., GaN trapping or thermal effects, or transmit power changes every time slot, etc.), digital correction adaptation and tracking of the changes is becoming increasingly difficult, as time slot period is shrinking (5G NR FR2 125-250 μs slot time) as standards evolve towards 6G and beyond. Therefore, there is a strong need for a digital correction system that can capture the dynamic changes but does not require fast adaptation. This greatly simplifies the adaptation.

Figure 6:
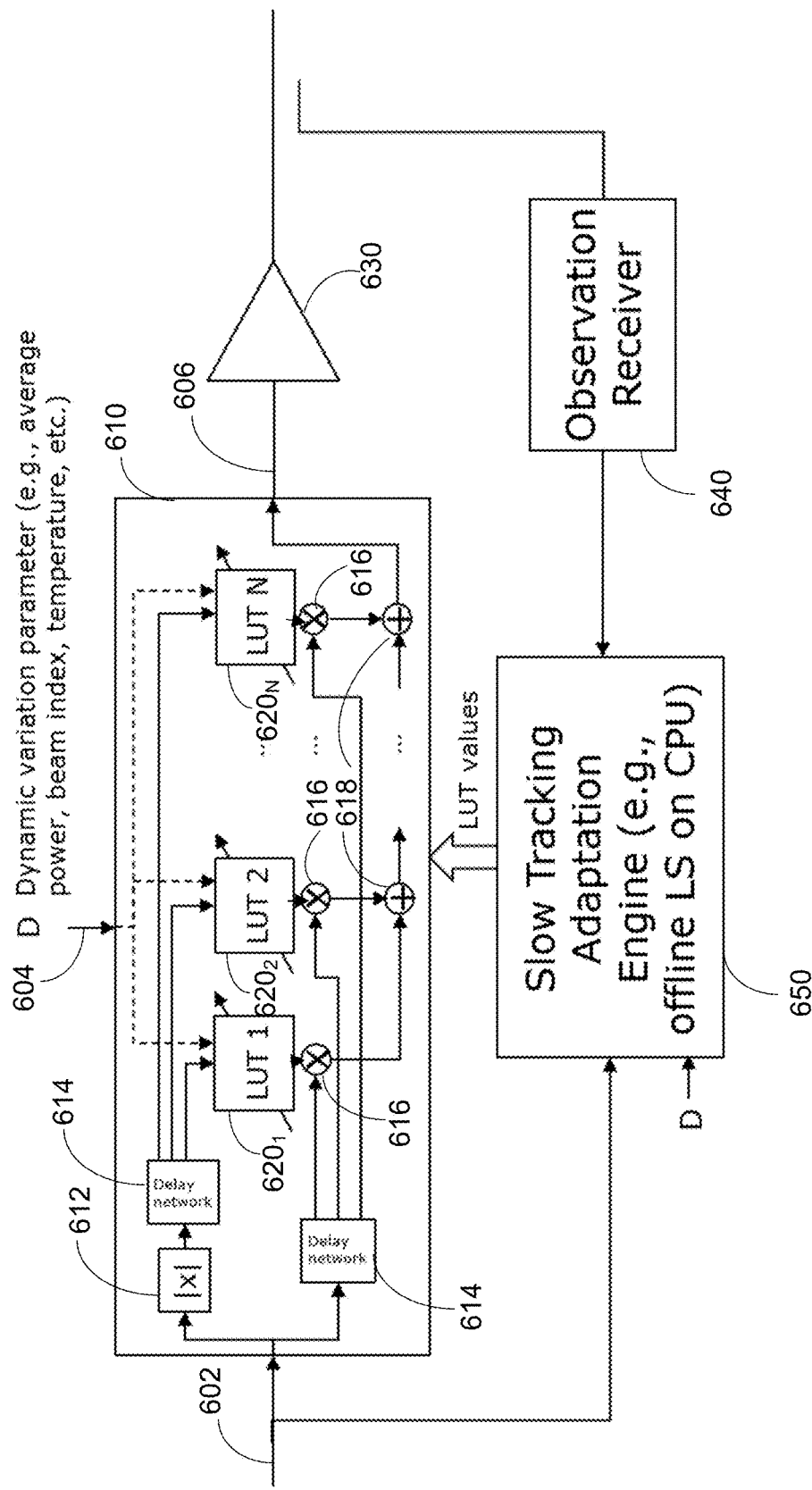
FIG. 6 shows an example system for digital correction for a dynamically varying non-linear system.

FIG. 6 shows an example system for digital correction for a dynamically varying non-linear system. The system 600 includes a correction circuitry 610 for pre-distorting the input signal that is sent to the non-linear system 630. The correction circuitry 610 includes at least one LUT 620₁-620$_N$. The magnitude (or power) of the input signal 602 is calculated by the magnitude (or power) computation circuitry 612 and used as an index to the LUT 620₁-620$_N$. The dynamically varying parameter 604 associated with the input signal 602 is also received by the correction circuitry 610 and used as an index to the LUT 620₁-620$_N$. Each LUT 620₁-620$_N$ may be one-dimensional LUTs or a two-dimensional LUT. The dynamically varying parameter 604 may be an average power of the input signal 602, a differential of the average power of the input signal 602, a directional beam index associated with the input signal 602, temperature, etc.

For implementing digital correction with memory, the digital correction circuit 610 may realize one or more LUTs 620₁-620$_N$ according to a memory depth, where each of the LUTs 620₁-620$_N$ produces an LUT output based on current or past input samples. The digital correction circuit 610 may then produce the corrected output by applying each LUT output as a gain to the corresponding LUT function of input samples and summing the resulting products to obtain the output. For a one-dimensional LUT case, the digital correction circuit 610 may receive a sequence of input samples and address the LUT with the signed real value of the input sample to produce an LUT output. The digital correction circuit 610 may then apply each LUT output as a gain factor to the corresponding function of the input samples and sum the resulting samples to obtain the corrected output.

The LUT output and the input signal (input sample) are multiplied by a multiplier 616 and summed by a summing network 618 to generate a pre-corrected (pre-distorted) output 606 which is provided to the non-linear system 630. The delay networks 614 are provided to delay the input samples for the corresponding LUTs and synchronize the LUT outputs and the input signals 602.

For adaptation of the LUTs, an adaptation engine 650 and an observation receiver 640 may be provided. The observation receiver 640 may receive the output from the non-linear system 630 as a feedback signal and provides samples of the feedback signal to the adaptation engine 650. The adaptation engine 650 may generate updated LUT values for the LUTs 620₁-620$_N$ based on the feedback signal and the input signal 602 using any adaptation algorithm, such as LMS, RLS, LS (Least Squares), ML (Machine Learning), etc. The adaptation engine 650 can be slow tracking, for example running offline on a CPU. Because the adaptation can be done offline, use of more sophisticated algorithms is possible.

Figure 7:
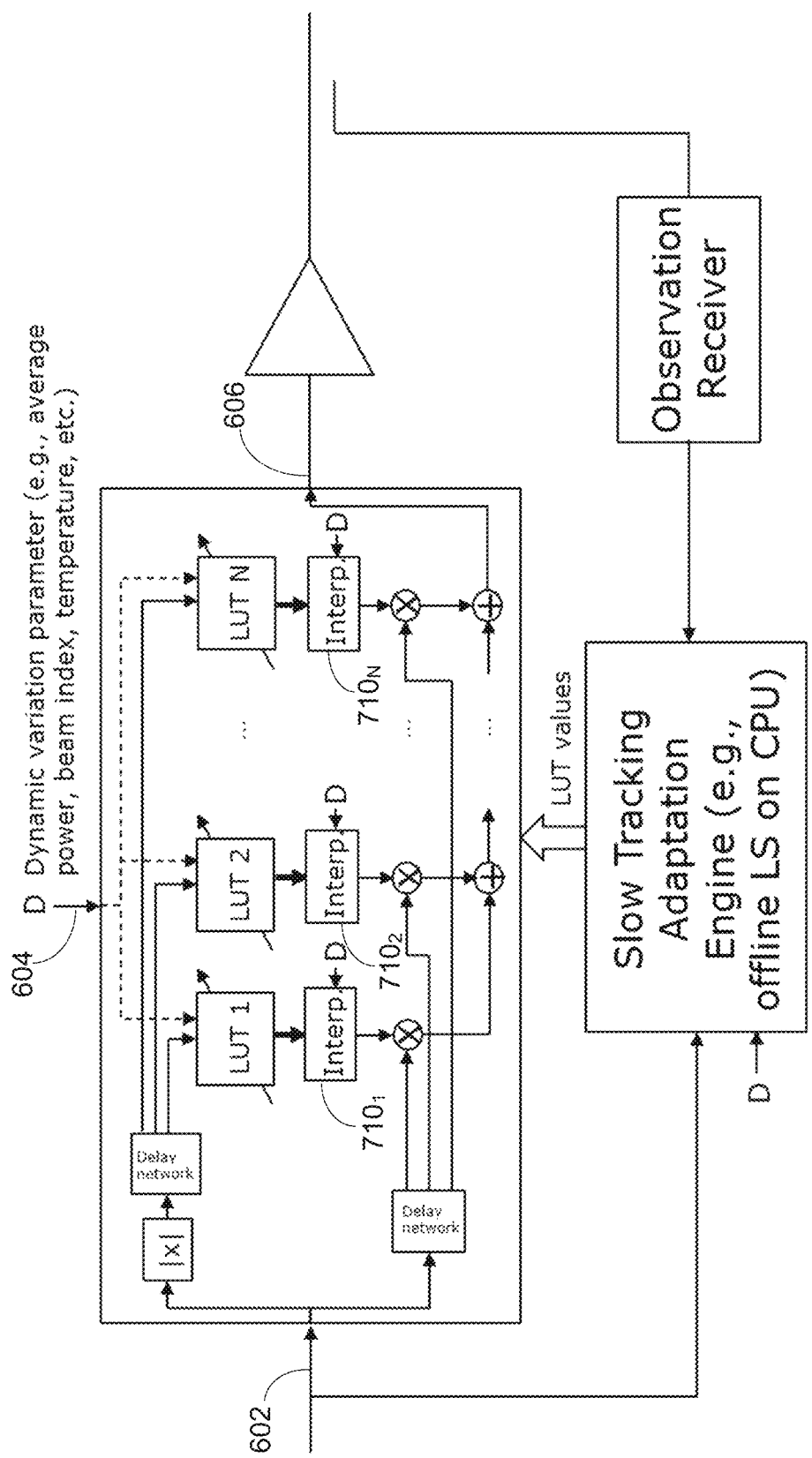
FIG. 7 shows an example system for digital correction for a dynamically varying non-linear system using interpolation or extrapolation.

In order to reduce the memory size of the LUT, a coarse quantization of the dynamically varying parameter (D) 604 and/or coarse quantization of the magnitude (or power) of the input signal 602 may be used for each of the LUTs 620₁-620$_N$ and the outputs from each LUT 620₁-620$_N$ may be interpolated or extrapolated by an interpolator 710₁-710$_N$ for the fine-grain result. FIG. 7 shows an example system for digital correction for a dynamically varying non-linear system using interpolation or extrapolation. The system in FIG. 7 is same as the system in FIG. 6 except the interpolation/extrapolation circuitry 710₁-710$_N$. Therefore, the details for the same components will not be explained for simplicity. The dynamically varying parameter 604 and/or the magnitude (or power) of the input signal 602 may be coarsely quantized and the coarsely quantized value of the dynamically varying parameter or the input signal magnitude (or power) may be used to generate LUT outputs and the LUT outputs are interpolated or extrapolated by the interpolation/extrapolation circuitry 710₁-710$_N$ and then multiplied with the input signal 602 and summed by a summing network to generate the pre-corrected (pre-distorted) output 606.

For implementing digital correction (e.g., DPD) in beam-forming systems, LUTs may be addressed by a beam index and a magnitude (or power) of the input signal. The beamforming system may switch directional beams dynamically. Each directional beam is associated with a beam index. The beam index is used as an index for addressing the LUT(s). The LUTs may be one-dimensional LUTs, or multi-dimensional LUT(s) (e.g., a two or three-dimensional LUT(s)).

As an example, for horizontal or vertical beamforming, the digital correction model may be written as follows:

$$y_n = \Sigma f_{l,m}(|x_{n-l}|, h) x_{n-m},  \quad \text{Equation (1)}$$

$$y_n = \Sigma f_{l,m}(|x_{n-l}|, v) x_{n-m},  \quad \text{Equation (2)}$$

where h and v are beam indexes for horizontal and vertical directions, respectively, x is input samples to the digital correction circuitry, y is output samples from the digital correction circuitry, f(.) is a function implemented by the LUT(s), and n, m, l are sample indexes. The digital correction model may be a memoryless model or a model with memory. In the example digital correction model in Equations (1) and (2), the LUT is addressed by the magnitude of the input sample x and the horizontal or vertical beam index (h or v).

For horizontal and vertical beamforming, the digital correction may be expressed as follows:

$$y_n = \Sigma f_{l,m}(|x_{n-l}|, h, v) x_{n-m}  \quad \text{Equation (3)}$$

The memory size for the LUT(s) could be prohibitive in some cases. For example, in case of 4b for h and 4b for v, a total of 256 sets of LUTs are needed for each non-linear function.

Figure 8:
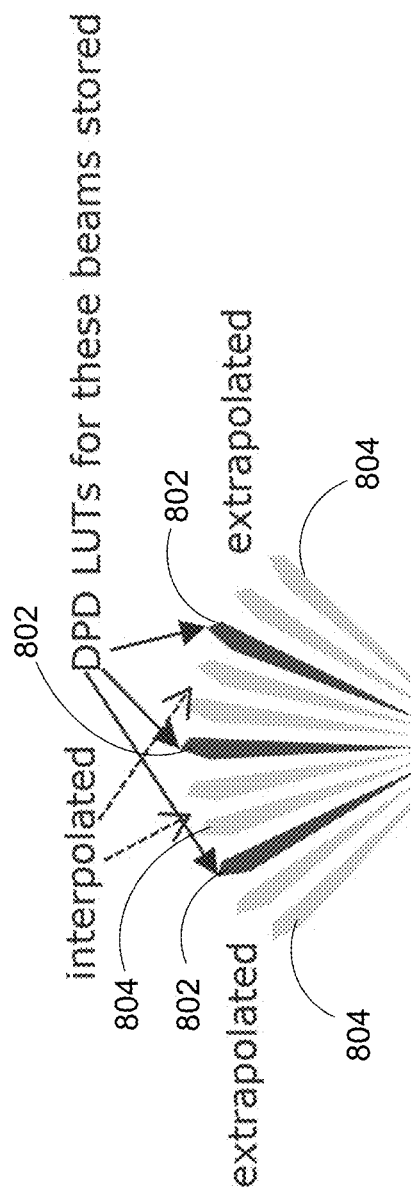
FIG. 8 shows an example for using a reduced size LUT(s) for reduced number of beams.

In order to reduce the memory size for the LUT, LUTs for a sub-set of beam indexes (a reduced number of beam indexes) may be used and linear or non-linear interpolation or extrapolation may be used for the remaining beams (same for 2D interpolation/extrapolation for h and v, e.g., bi-linear). FIG. 8 shows an example for using a reduced size LUT(s) for reduced number of beams. LUTs are stored and used for a sub-set of beams 802 (e.g., evenly distributed over all possible beams) and for the remaining beams 804, interpolation or extrapolation may be used based on the stored LUT values.

For implementing digital correction in systems with dynamic average power, an average power may be computed for a predetermined period of time (e.g., a time slot) and an LUT(s) may be addressed with the average power. The average power value may be used as indices for addressing the LUT(s). The digital correction may be expressed as follows:

$$y_n = \Sigma f_{l,m}(|x_{n-l}|, \|x\|) x_{n-m},  \quad \text{Equation (4)}$$

where x is input samples to the digital correction circuitry, y is output samples from the digital correction circuitry, $\|x\|$ represents the average power of x, f(.) is a function implemented by the LUT(s), and n, m, l are sample indexes. The digital correction model may be a memoryless model or a model with memory. In the example digital correction model in Equation (4), the LUT is addressed by the magnitude of the input sample x and the average power of the input samples.

To reduce the LUT size, a reduced size LUT(s) for few average power values may be stored and used, and for the average power values that are not stored in the LUT(s), linear or non-linear interpolation or extrapolation may be used.

Figure 9:
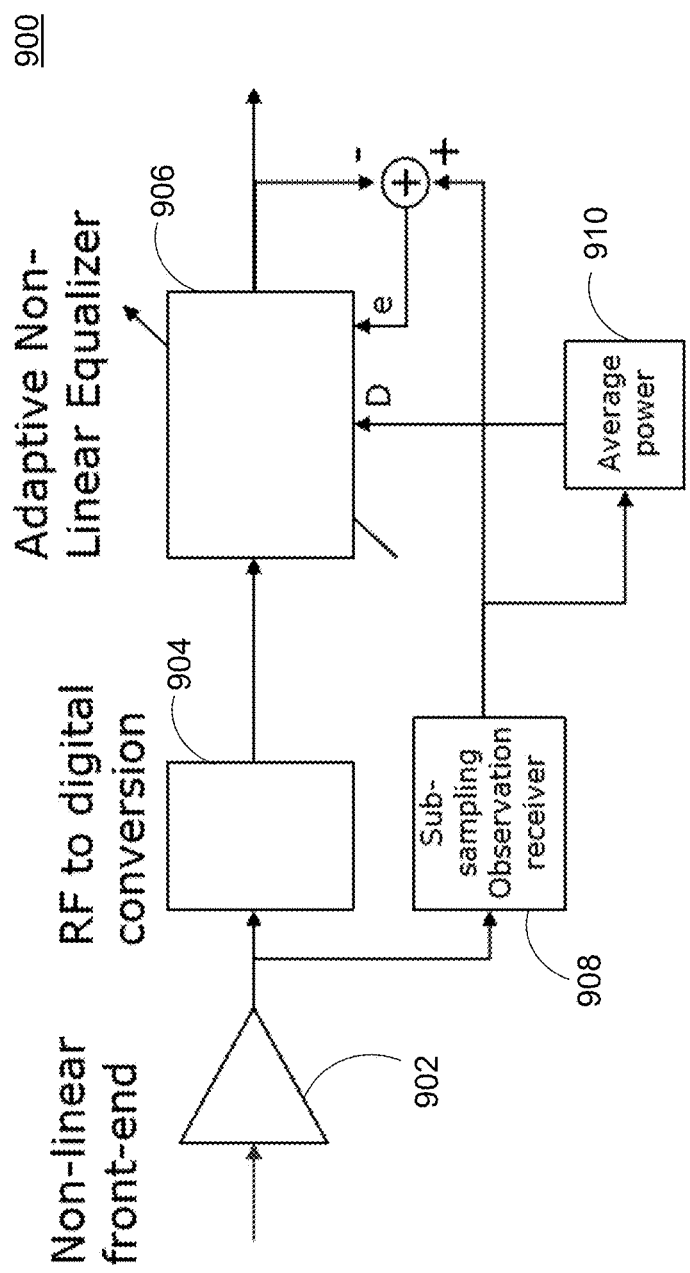
FIG. 9 shows an example receiver including a system for digital correction for a dynamically varying non-linear system.

Digital correction may be implemented in a receiver as well. FIG. 9 shows an example receiver 900 including a system for digital correction for a dynamically varying non-linear system. The receiver 900 includes a non-linear front-end circuitry 902 for processing a received radio frequency (RF) signal. The received RF signal is converted to a digital signal by the RF-to-digital conversion circuitry 904 including an analog-to-digital converter (ADC). An adaptative non-linear equalizer 906 is provided to correct the distortion incurred by the non-linear front-end circuitry (such as low noise amplifier (LNA), RF circuits, ADC input buffer, etc.) 902 and the conversion circuitry 904. The adaptative non-linear equalizer 906 includes at least one LUT to be addressed by a dynamically varying parameter, (in this example, an average power (e.g., detecting a blocker). To calculate the average power of the received signal, an observation receiver 908 (e.g., a sub-sampling receiver) may be provided to sample the received signal and the average power computation circuitry 910 computes the average power of the received signal. The adaptative non-linear equalizer 906 processes the received digital signal using LUT(s) that are addressed by the dynamically varying parameter, such as average power of the received signal.

In accordance with the examples disclosed herein the dynamic changes in the system are captured with simple parameters such as a beam index or instantaneous average power of the transmit or receive signal, and this allows a slow (e.g., off-line) adaptation of the correction circuitry such as a DPD system or a non-linear equalizer.

Use of the dynamically varying parameters such as a directional beam index makes it possible to use adaptive correction in wireless systems such as mmWave applications, allowing increased transmit power, and much higher power efficiency (e.g., from <5% to 20%) resulting in very significant power saving for wireless operators.

Figure 10:
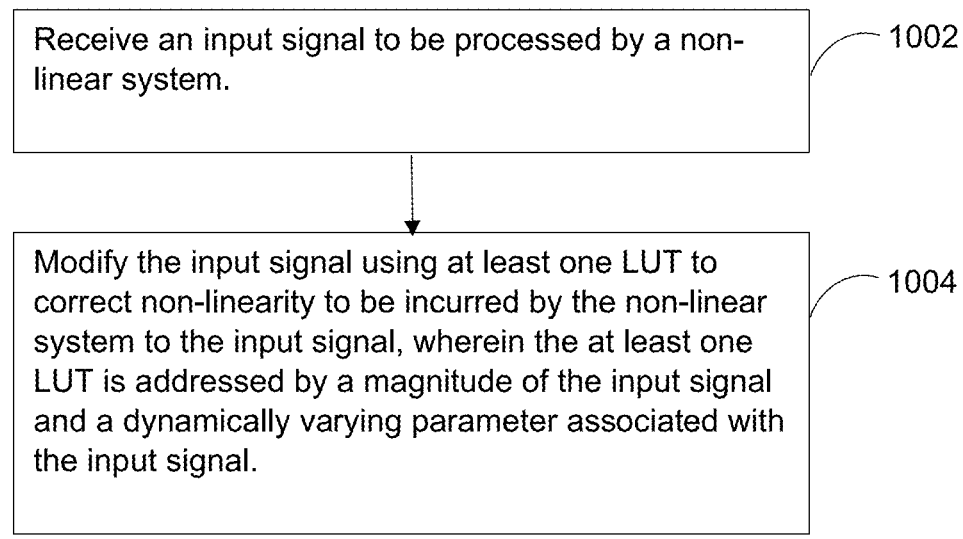
FIG. 10 is a flow diagram of an example process for digital correction for a dynamically varying non-linear system.

FIG. 10 is a flow diagram of an example process for digital correction for a dynamically varying non-linear system. The method includes receiving an input signal to be processed by a non-linear system (1002) and modifying the input signal using at least one LUT to correct non-linearity to be incurred by the non-linear system to the input signal (1004). The at least one LUT is addressed by a magnitude or power of the input signal and a dynamically varying parameter associated with the input signal.

The dynamically varying parameter may be one of average signal power of the input signal, a differential of the average power of the input signal, a direction beam index, or temperature. The non-linear system may include a power amplifier or a front-end circuitry and a quantizer in a receiver. The at least one LUT may use coarse quantization of the dynamically varying parameter, and the method further including performing interpolation or extrapolation of LUT values obtained from the at least one LUT. The interpolation or extrapolation may be one of linear, cubic spline, bi-linear interpolation or extrapolation. The LUT may be addressed by a horizontal beam index, a vertical beam index, or both. The at least one LUT may include a plurality of one-dimensional LUTs or a multi-dimensional LUT(s).

Figure 11:
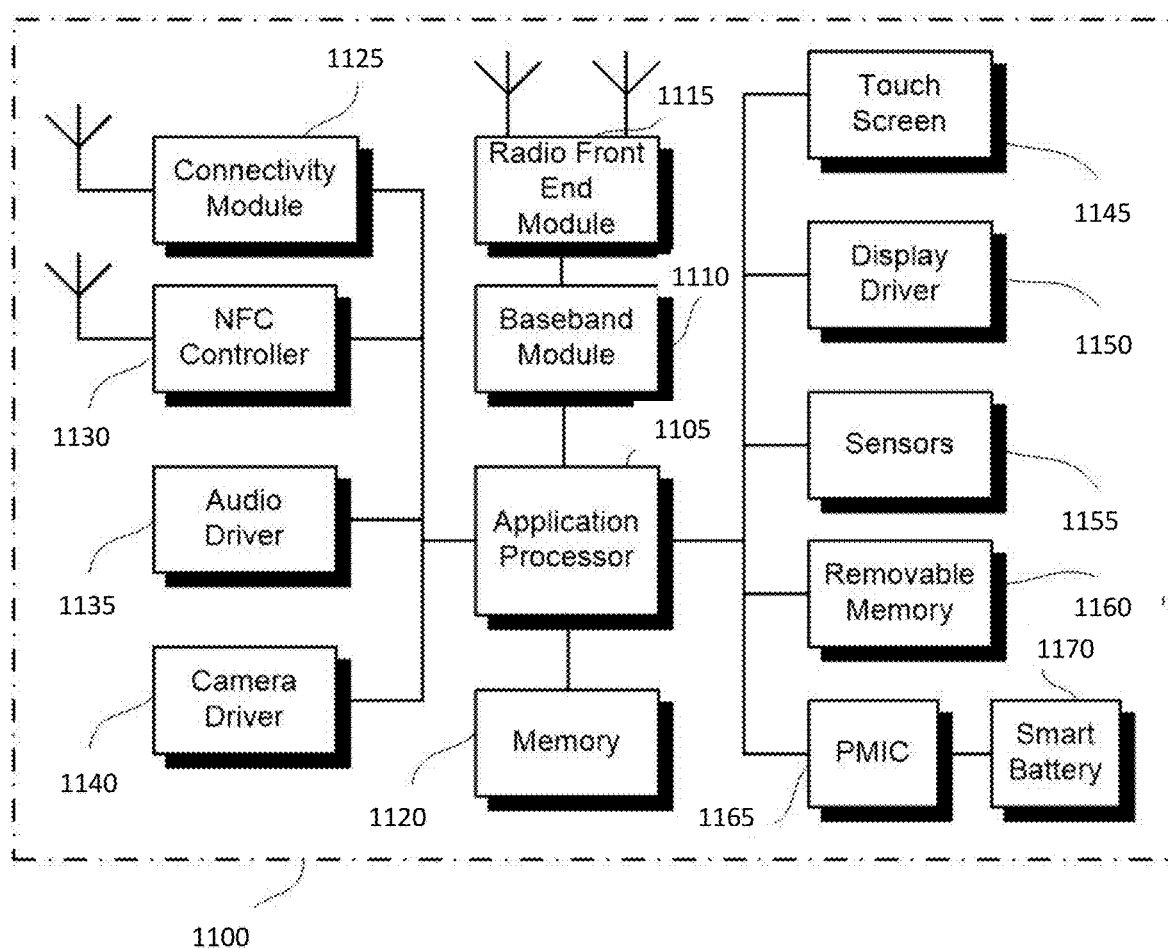
FIG. 11 illustrates a user device in which the examples disclosed herein may be implemented.

FIG. 11 illustrates a user device 1100 in which the examples disclosed herein may be implemented. For example, the examples disclosed herein may be implemented in the radio front-end module 1115, in the baseband module 1110, etc. The user device 1100 may be a mobile device in some aspects and includes an application processor 1105, baseband processor 1110 (also referred to as a baseband module), radio front end module (RFEM) 1115, memory 1120, connectivity module 1125, near field communication (NFC) controller 1130, audio driver 1135, camera driver 1140, touch screen 1145, display driver 1150, sensors 1155, removable memory 1160, power management integrated circuit (PMIC) 1165 and smart battery 1170.

In some aspects, application processor 1105 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1110 may be implemented, for example, as a solder-down substrate including one or more integrated circuits, a single packaged integrated circuit soldered to a main circuit board, and/or a multi-chip module containing two or more integrated circuits.

Figure 12:
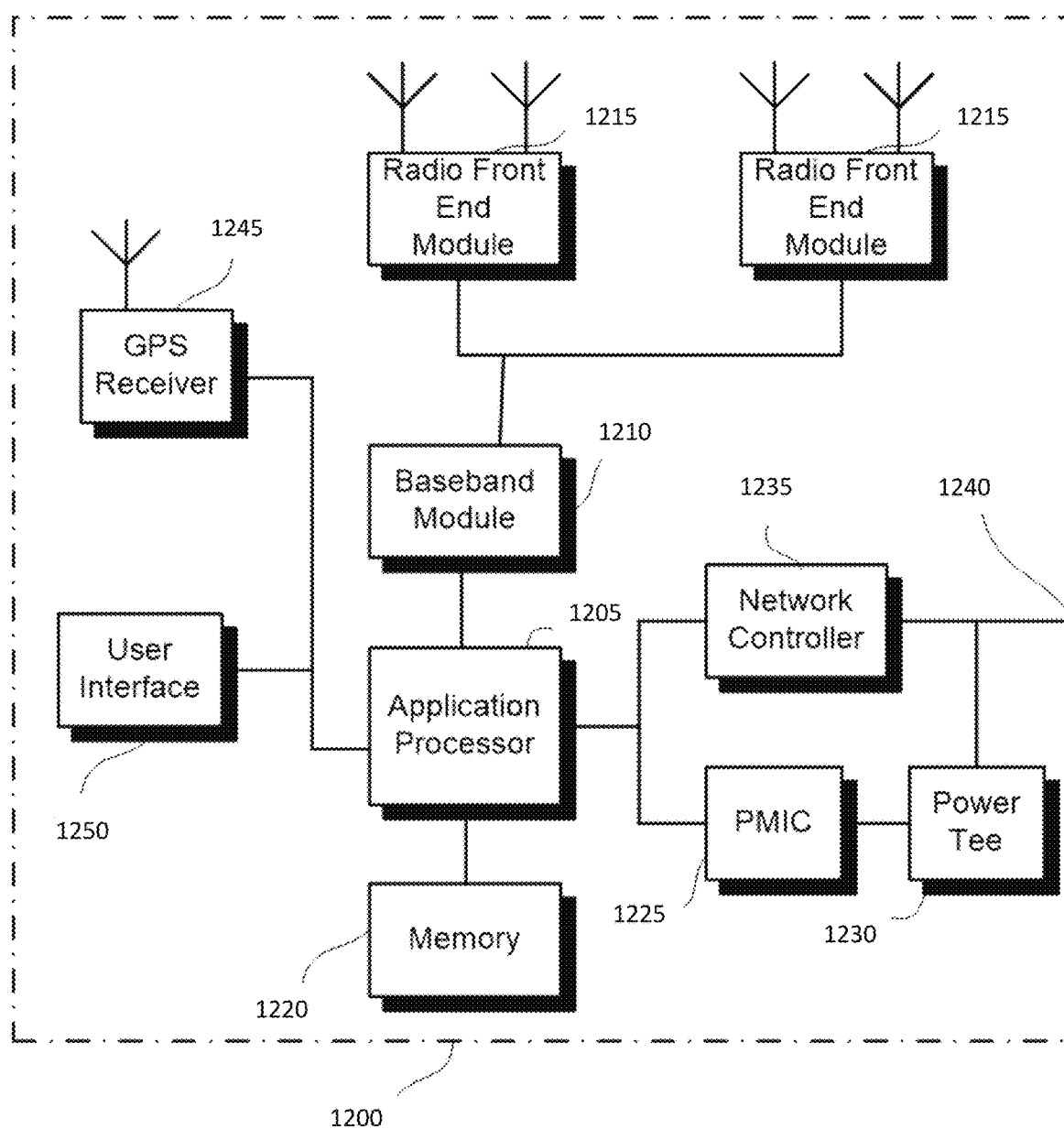
FIG. 12 illustrates a base station or infrastructure equipment radio head in which the examples disclosed herein may be implemented.

FIG. 12 illustrates a base station or infrastructure equipment radio head 1200 in which the examples disclosed herein may be implemented. For example, the examples disclosed herein may be implemented in the radio front-end module 1215, in the baseband module 1210, etc. The base station radio head 1200 may include one or more of application processor 1205, baseband modules 1210, one or more radio front end modules 1215, memory 1220, power management circuitry 1225, power tee circuitry 1230, network controller 1235, network interface connector 1240, satellite navigation receiver module 1245, and user interface 1250.

In some aspects, application processor 1205 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1210 may be implemented, for example, as a solder-down substrate including one or more integrated circuits, a single packaged integrated circuit soldered to a main circuit board or a multi-chip module containing two or more integrated circuits.

In some aspects, memory 1220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1220 may be implemented as one or more of solder down packaged integrated circuits, socketed memory modules and plug-in memory cards.

In some aspects, power management integrated circuitry 1225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1230 may provide for electrical power drawn from a network cable to provide both power supply and data connectivity to the base station radio head 1200 using a single cable.

In some aspects, network controller 1235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1245 may provide data to application processor 1205 which may include one or more of position data or time data. Application processor 1205 may use time data to synchronize operations with other radio base stations.

In some aspects, user interface 1250 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows.

An example, (e.g., example 1) relates to a system for digital correction for a dynamically varying non-linear system. The system includes a correction circuitry including at least one LUT, wherein the correction circuitry is configured to receive an input signal and modify the input signal to be processed by the non-linear system using at least one LUT to correct non-linearity incurred by the non-linear system, wherein the at least one LUT is addressed by a magnitude or power of the input signal and a dynamically varying parameter associated with the input signal.

Another example (e.g., example 2) relates to a previously described example (e.g., example 1), wherein the dynamically varying parameter is one of average signal power of the input signal, a differential of the average power of the input signal, a directional beam index, or temperature.

Another example (e.g., example 3) relates to a previously described example (e.g., any one of examples 1-2), wherein the non-linear system includes a power amplifier.

Another example (e.g., example 4) relates to a previously described example (e.g., any one of examples 1-3), wherein the non-linear system includes a front-end circuitry and a quantizer in a receiver.

Another example (e.g., example 5) relates to a previously described example (e.g., any one of examples 1-4), wherein the at least one LUT uses coarse quantization of the dynamically varying parameter and/or coarse quantization of the magnitude or power of the input signal, and the correction circuitry is configured to perform interpolation or extrapolation.

Another example (e.g., example 6) relates to a previously described example (e.g., example 5), wherein the interpolation or extrapolation is one of linear, cubic spline, bi-linear interpolation or extrapolation.

Another example (e.g., example 7) relates to a previously described example (e.g., any one of examples 1-6), wherein the LUT is addressed by a horizontal beam index, a vertical beam index, or both.

Another example (e.g., example 8) relates to a previously described example (e.g., any one of examples 1-7), wherein the at least one LUT includes a plurality of one-dimensional LUTs.

Another example (e.g., example 9) relates to a previously described example (e.g., any one of examples 1-8), wherein the at least one LUT includes a multi-dimensional LUT.

Another example (e.g., example 10) relates to a method for digital correction for a dynamically varying non-linear system. The method includes receiving an input signal to be processed by a non-linear system, and modifying the input signal using at least one LUT to correct non-linearity to be incurred by the non-linear system to the input signal, wherein the at least one LUT is addressed by a magnitude or power of the input signal and a dynamically varying parameter associated with the input signal.

Another example (e.g., example 11) relates to a previously described example (e.g., example 10), wherein the dynamically varying parameter is one of average signal power of the input signal, a differential of the average power of the input signal, a directional beam index, or temperature.

Another example (e.g., example 12) relates to a previously described example (e.g., any one of examples 10-11), wherein the non-linear system includes a power amplifier.

Another example (e.g., example 13) relates to a previously described example (e.g., any one of examples 10-12), wherein the non-linear system includes a front-end circuitry and a quantizer in a receiver.

Another example (e.g., example 14) relates to a previously described example (e.g., any one of examples 10-13), wherein the at least one LUT uses coarse quantization of the dynamically varying parameter and/or coarse quantization of the magnitude or power of the input signal, and the method further including performing interpolation or extrapolation of LUT values obtained from the at least one LUT.

Another example (e.g., example 15) relates to a previously described example (e.g., example 14), wherein the interpolation or extrapolation is one of linear, cubic spline, bi-linear interpolation or extrapolation.

Another example (e.g., example 16) relates to a previously described example (e.g., any one of examples 10-15), wherein the LUT is addressed by a horizontal beam index, a vertical beam index, or both.

Another example (e.g., example 17) relates to a previously described example (e.g., any one of examples 10-16), wherein the at least one LUT includes a plurality of one-dimensional LUTs.

Another example (e.g., example 18) relates to a previously described example (e.g., any one of examples 10-17), wherein the at least one LUT includes a multi-dimensional LUT.

Another example (e.g., example 19) relates to a non-transitory machine-readable storage medium including machine readable instructions, when executed, to implement a method of claim 10.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A system for digital correction for a dynamically varying non-linear system, comprising:
  a correction circuitry including at least one look-up table (LUT), wherein the correction circuitry is configured to receive an input signal and modify the input signal to be processed by the non-linear system using at least one LUT to correct non-linearity incurred by the non-linear system, wherein the at least one LUT is addressed by a magnitude or power of the input signal and a dynamically varying parameter associated with the input signal,
  wherein the dynamically varying parameter is one of average signal power of the input signal, a differential of the average power of the input signal, a directional beam index, or temperature.

2. The system of claim 1, wherein the non-linear system includes a power amplifier.

3. The system of claim 1, wherein the non-linear system includes a front-end circuitry and a quantizer in a receiver.

4. The system of claim 1, wherein the at least one LUT uses coarse quantization of the dynamically varying parameter and/or coarse quantization of the magnitude or power of the input signal, and the correction circuitry is configured to perform interpolation or extrapolation.

5. The system of claim 4, wherein the interpolation or extrapolation is one of linear, cubic spline, bi-linear interpolation or extrapolation.

6. The system of claim 1, wherein the LUT is addressed by a horizontal beam index, a vertical beam index, or both.

7. The system of claim 1, wherein the at least one LUT includes a plurality of one-dimensional LUTs.

8. The system of claim 1, wherein the at least one LUT includes a multi-dimensional LUT.

9. A method for digital correction for a dynamically varying non-linear system, comprising:
  receiving an input signal to be processed by a non-linear system; and modifying the input signal using at least one look-up table (LUT) to correct non-linearity to be incurred by the non-linear system to the input signal, wherein the at least one LUT is addressed by a magnitude or power of the input signal and a dynamically varying parameter associated with the input signal, wherein the dynamically varying parameter is one of average signal power of the input signal, a differential of the average power of the input signal, a directional beam index, or temperature.

10. The method of claim 9, wherein the non-linear system includes a power amplifier.

11. The method of claim 9, wherein the non-linear system includes a front-end circuitry and a quantizer in a receiver.

12. The method of claim 9, wherein the at least one LUT uses coarse quantization of the dynamically varying parameter and/or coarse quantization of the magnitude or power of the input signal, and the method further including performing interpolation or extrapolation of LUT values obtained from the at least one LUT.

13. The method of claim 12, wherein the interpolation or extrapolation is one of linear, cubic spline, bi-linear interpolation or extrapolation.

14. The method of claim 9, wherein the LUT is addressed by a horizontal beam index, a vertical beam index, or both.

15. The method of claim 9, wherein the at least one LUT includes a plurality of one-dimensional LUTs.

16. The method of claim 9, wherein the at least one LUT includes a multi-dimensional LUT.

17. A non-transitory machine-readable storage medium including machine readable instructions, when executed, to implement a method of claim 10.

* * * * *